United States Patent [19]

Koyama

[11] Patent Number: 5,058,168
[45] Date of Patent: Oct. 15, 1991

[54] OVERFLOW SPEECH DETECTING APPARATUS FOR SPEECH RECOGNITION

[75] Inventor: Motoaki Koyama, Yokohama, Japan

[73] Assignee: Kabushiki Kaisha Toshiba, Kawasaki, Japan

[21] Appl. No.: 552,325

[22] Filed: Jul. 13, 1990

Related U.S. Application Data

[63] Continuation of Ser. No. 371,000, Jun. 26, 1989, abandoned.

[30] Foreign Application Priority Data

Jun. 27, 1988 [JP] Japan .................................. 63-158707

[51] Int. Cl.$^5$ .............................................. G10L 5/00
[52] U.S. Cl. ...................................................... 381/46
[58] Field of Search ................................... 381/41–47; 364/513.5

[56] References Cited

U.S. PATENT DOCUMENTS

| | | | |
|---|---|---|---|
| 4,573,187 | 2/1986 | Bui et al. | 381/43 |
| 4,597,098 | 6/1986 | Noso et al. | 381/46 |
| 4,624,008 | 11/1986 | Vensko et al. | 364/513.5 |
| 4,624,009 | 11/1986 | Glenn et al. | 381/43 |
| 4,707,857 | 11/1987 | Marley et al. | 381/45 |
| 4,720,802 | 1/1988 | Damoulakis | 381/43 |
| 4,829,578 | 5/1989 | Roberts | 364/513.5 |

Primary Examiner—Emanuel S. Kemeny
Attorney, Agent, or Firm—Finnegan, Henderson, Farabow, Garrett, and Dunner

[57] ABSTRACT

Time-serial pattern data of feature parameters representing the frequency feature of input speech is obtained from an input speech signal and is output from a frequency analyzer. This time-serial pattern data is plotted on the frequency and time base axes in relation to a power level. A Central Processing Unit detects that the feature parameters continuously exceed a predetermined value for a predetermined period of time or more. The detection output is supplied to an amplifier, and its input gain is controlled to be an optimal value.

10 Claims, 7 Drawing Sheets

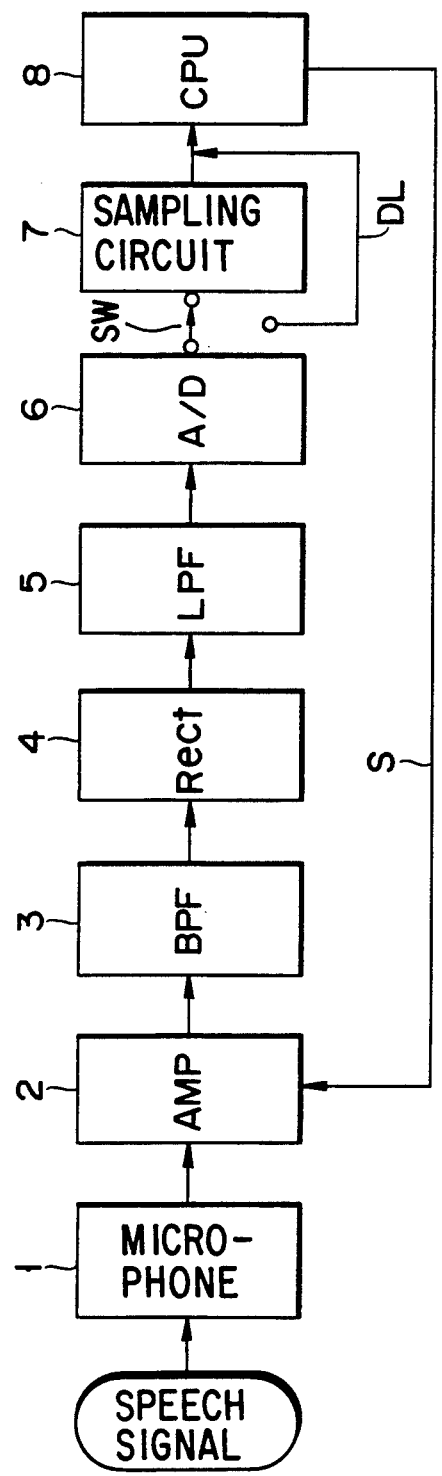
F I G. 3
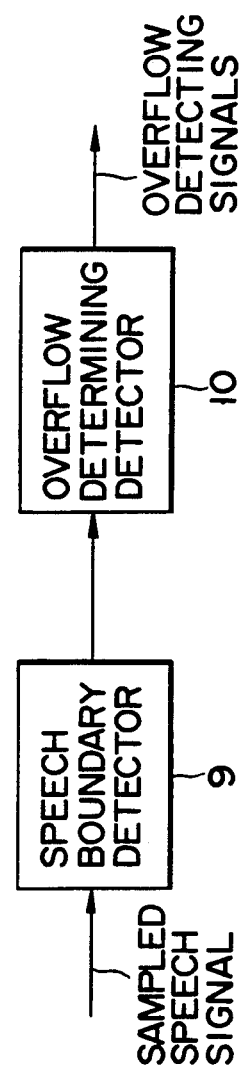
F I G. 4

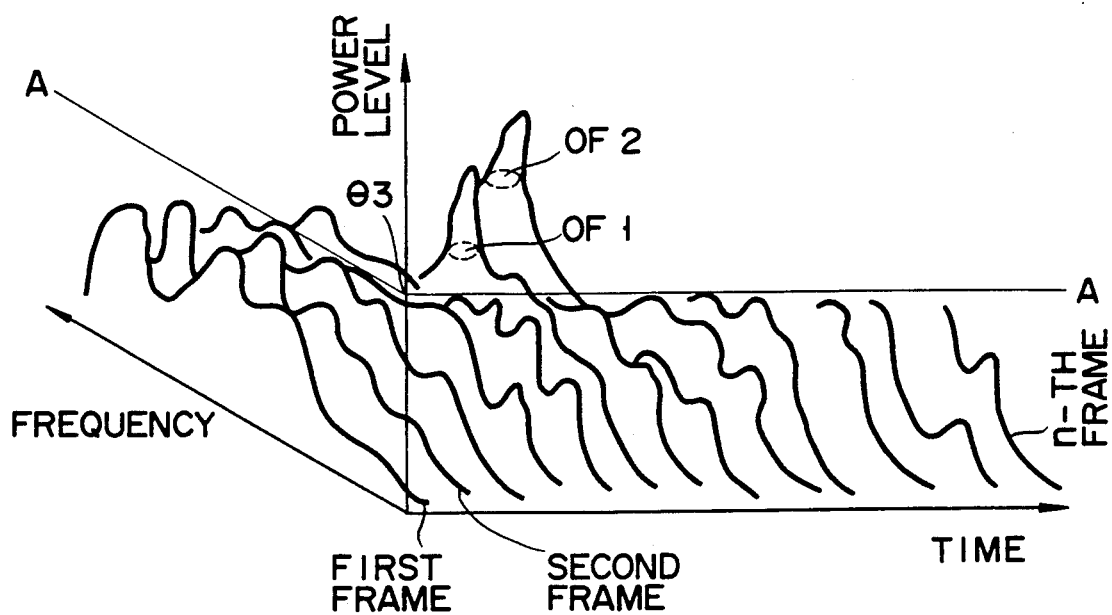
F I G. 5
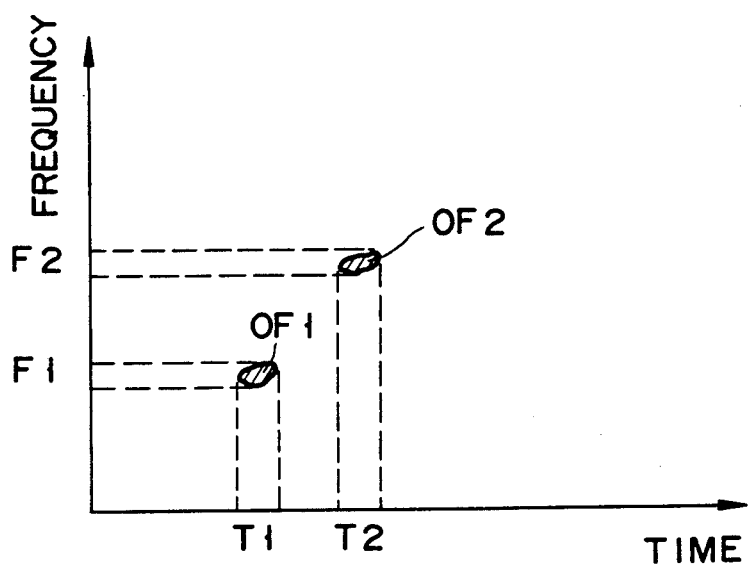
F I G. 6

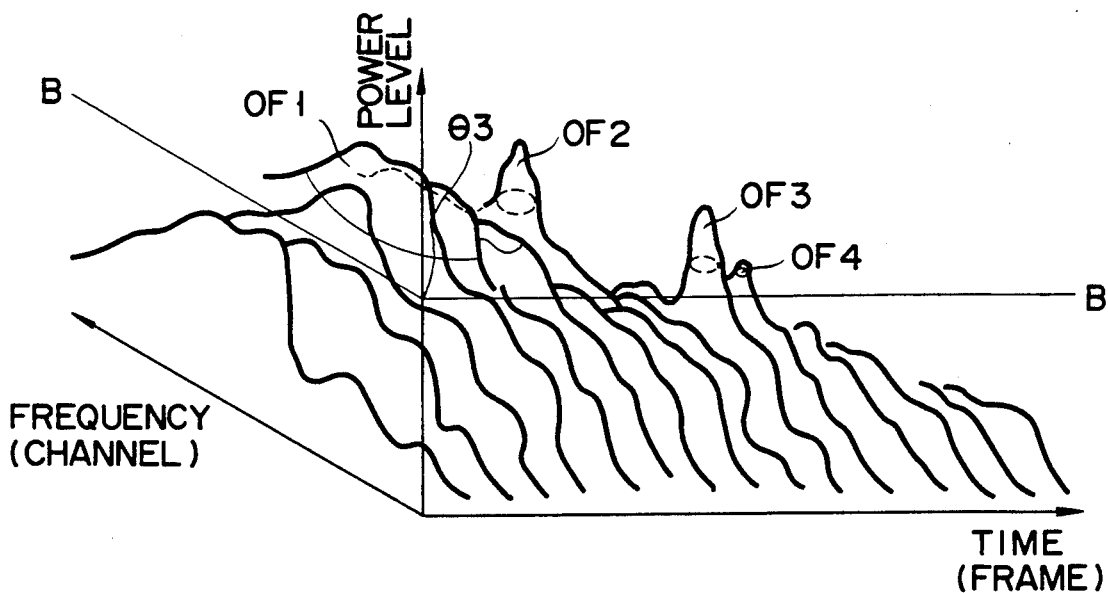
F I G. 7
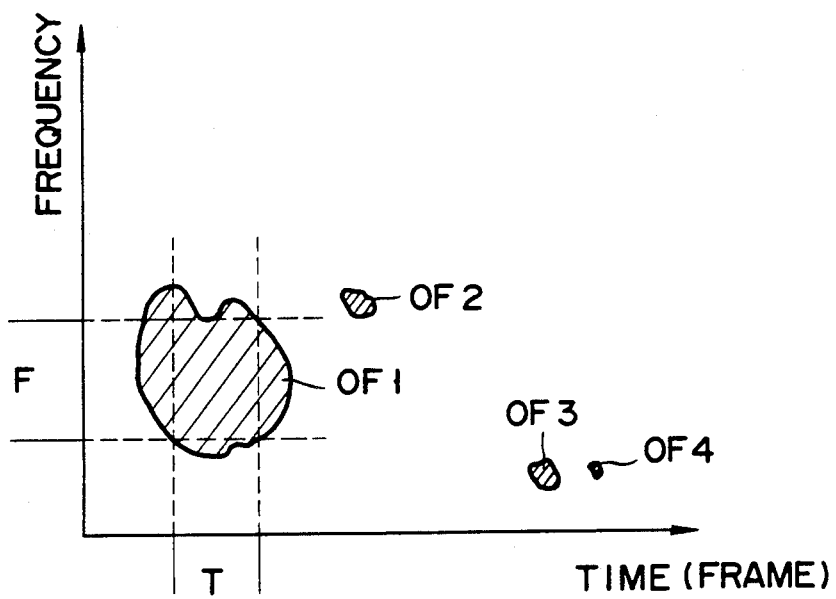
F I G. 8

OVERFLOW SPEECH DETECTING APPARATUS FOR SPEECH RECOGNITION

This application is a continuation, of application Ser. No. 07/371,000, filed Jun. 26, 1989, now abandoned.

BACKGROUND OF THE INVENTION

1. Field of the Invention

The present invention relates to an overflow speech detecting apparatus and, more particularly, to an overflow speech detecting apparatus used in a speech recognition system, for example, to determine whether input speech overflows or not.

2. Description of the Related Art

A conventional overflow detecting apparatus used in, e.g., a speech recognition system, compares the power level of a speech input signal with a given threshold value $\theta 1$, as shown in FIG. 1. In this method, if the power level exceeds the threshold value $\theta 1$, the apparatus determines speech overflow. In another method, as shown in FIG. 2, if the dynamic range of input speech in a speech recognition system is set to be 0 to $\theta 2$, an overflow detecting apparatus detects overflow speech if the power level of input speech exceeds the upper limit $\theta 2$ and an overflow occurs. If an overflow is detected by only checking whether an input power level exceeds the predetermined upper limit $\theta 1$ or $\theta 2$, overflow speech is determined even though the power level of the most part of input speech does not overflow like a pulse noise. In the case when the gain of the input speech signal is decreased in accordance with the determination, the power level of the overall input speech signal is lowered, and the power level feature pattern of the speech becomes ambiguous. In speech recognition, this leads to a decrease in recognition rate or accuracy.

SUMMARY OF THE INVENTION

The present invention has been made in consideration of the above situation, and provides an overflow speech detecting apparatus which can eliminate the conventional drawback that if pulse-like noise or speech is input, overflow speech is determined even though the most part of the input speech does not overflow, and which can evaluate the overflow state of input speech without decreasing the speech recognition rate.

According to an overflow speech detecting apparatus, feature parameters are extracted from input speech by using a speech analyzing means, and whether the input speech overflows or not is determined by using a means for detecting that a series of feature parameters exceeds a predetermined value for a predetermined period of time or more on a time-serial pattern of the feature parameters.

According to the above-described arrangement, if the interval during which the series of feature parameters exceeds the threshold value on the time-serial pattern of the feature parameters of the input speech is shorter than the predetermined value, the input speech is not determined to overflow. Even if pulse-like noise or speech instantaneously exceeds the threshold value, an overflow is not determined. Therefore, an input gain is not unnecessarily decreased In addition, in speech recognition, the problem of a decrease in recognition rate can be solved.

BRIEF DESCRIPTION OF THE DRAWINGS

FIG. 3 is a schematic block diagram showing an overflow speech detecting apparatus according to an embodiment of the present invention;

FIG. 4 is a block diagram showing a function of a CPU in FIG. 3;

FIG. 5 is a graph showing a frequency analysis of speech which is not determined to be an overflow speech according to the present invention;

FIG. 6 is a sectional view taken along a plane A—A in FIG. 5;

FIG. 7 is a graph showing a frequency analysis of speech which is determined to be an overflow speech according to the present invention;

FIG. 8 is a sectional view taken along a plane B—B in FIG. 7;

DETAILED DESCRIPTION OF THE PREFERRED EMBODIMENTS

Figure 1:
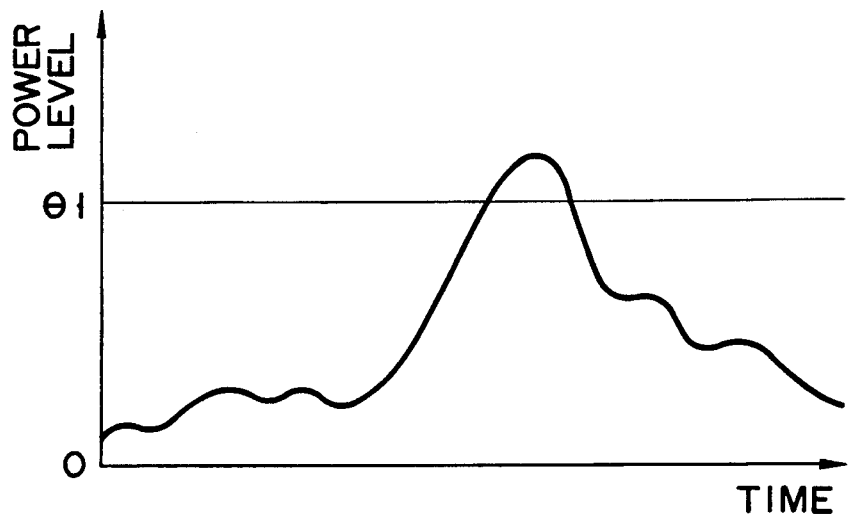
FIGS. 1 and 2 are graphs each showing a conventional method of determining overflow speech.
Figure 2:
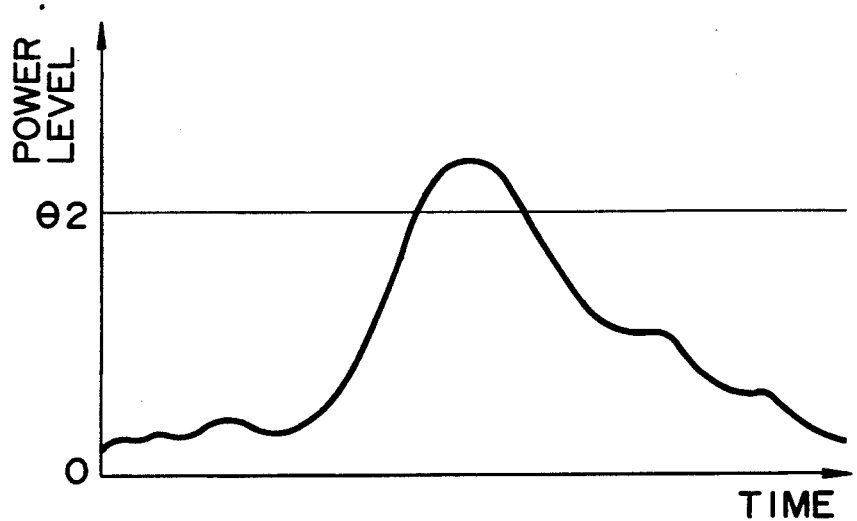

An embodiment of the present invention will be described below with reference to FIGS. 3 to 10.

FIG. 3 is a schematic block diagram showing an overflow speech detecting apparatus according to the embodiment of the present invention.

Referring to FIG. 3, speech is converted into a speech signal by a microphone 1. The speech signal is input to a BPF (Band-Pass Filter) 3 through an amplifier 2. The speech signal is then output from the BPF 3 as a feature parameter output. This output is rectified by a rectifier 4. An LPF (Low-Pass Filter) 5 extracts only a low-frequency component from the rectified signal. The extracted analog signal is then converted into a digital signal by an A/D converter 6. If data compression of the digital signal is required, a signal component sampled at a predetermined period by a sampling circuit 7 is input to a CPU 8 for overflow speech detection. If data compression is not required, the digital signal can be directly supplied from the A/D converter 6 to the CPU 8, i.e., from a switch SW to the CPU 8 through a line DL. If input speech is determined to overflow by the overflow speech detecting apparatus having the above-described arrangement, an overflow detecting signal S is output from the CPU 8 to the control input terminal of the amplifier 2 so as to decrease the input gain of the amplifier 2. FIG. 4 is a block diagram showing a function of the CPU 8.

Referring to FIG. 4, the speech boundary of input speech is detected by a speech boundary detector 9 included in the CPU 8. An overflow determining detector 10 then determines whether the speech input overflows or not. If the detector 10 determines an overflow, it outputs the overflow detecting signal S. The above-described overflow speech detecting apparatus detects overflow speech when a feature parameter has a width F [Hz] in the direction of the frequency axis and continuously exceeds a threshold value $\theta 3$ for a time T [msec]

in the time base direction on a time-serial pattern of feature parameters of the input speech.

According to such a method of detecting overflow speech, as shown in FIGS. 5 and 6, if frequency range F1, F2 in which power level exceeds the threshold value $\theta 3$ is narrower than a prescribed width, or times T1, T2 during which they exceed the value $\theta 3$ is shorter than a predetermined period T, input speech is not determined to overflow. In contrast to this, if input speech exceeds the threshold value $\theta 3$ for a given time T or more in a given frequency band F or were as shown in FIGS. 7 and 8, the input speech is determined to overflow.

In speech recognition, speech whose maximum value slightly exceeds the threshold value $\theta 3$ but whose speech waveform feature is distinct is easy to recognize as compared with speech whose input is decreased not to cause its maximum value to exceed the threshold value $\theta 3$.

Figure 9A:
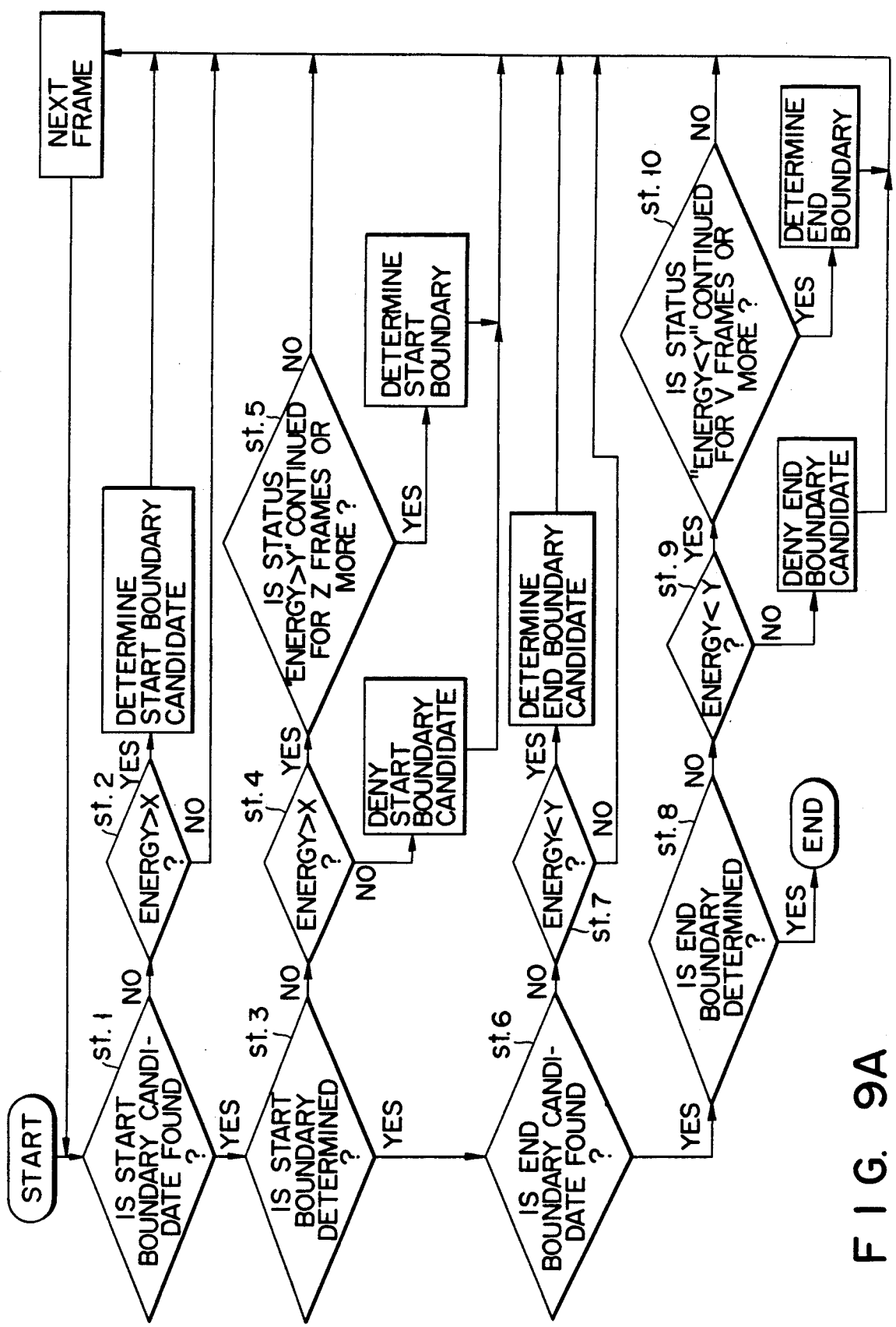
FIGS. 9A and 9B are a flow chart and a graph, respectively, for explaining a method of detecting a speech boundary of input speech according to the present invention.
Figure 10:
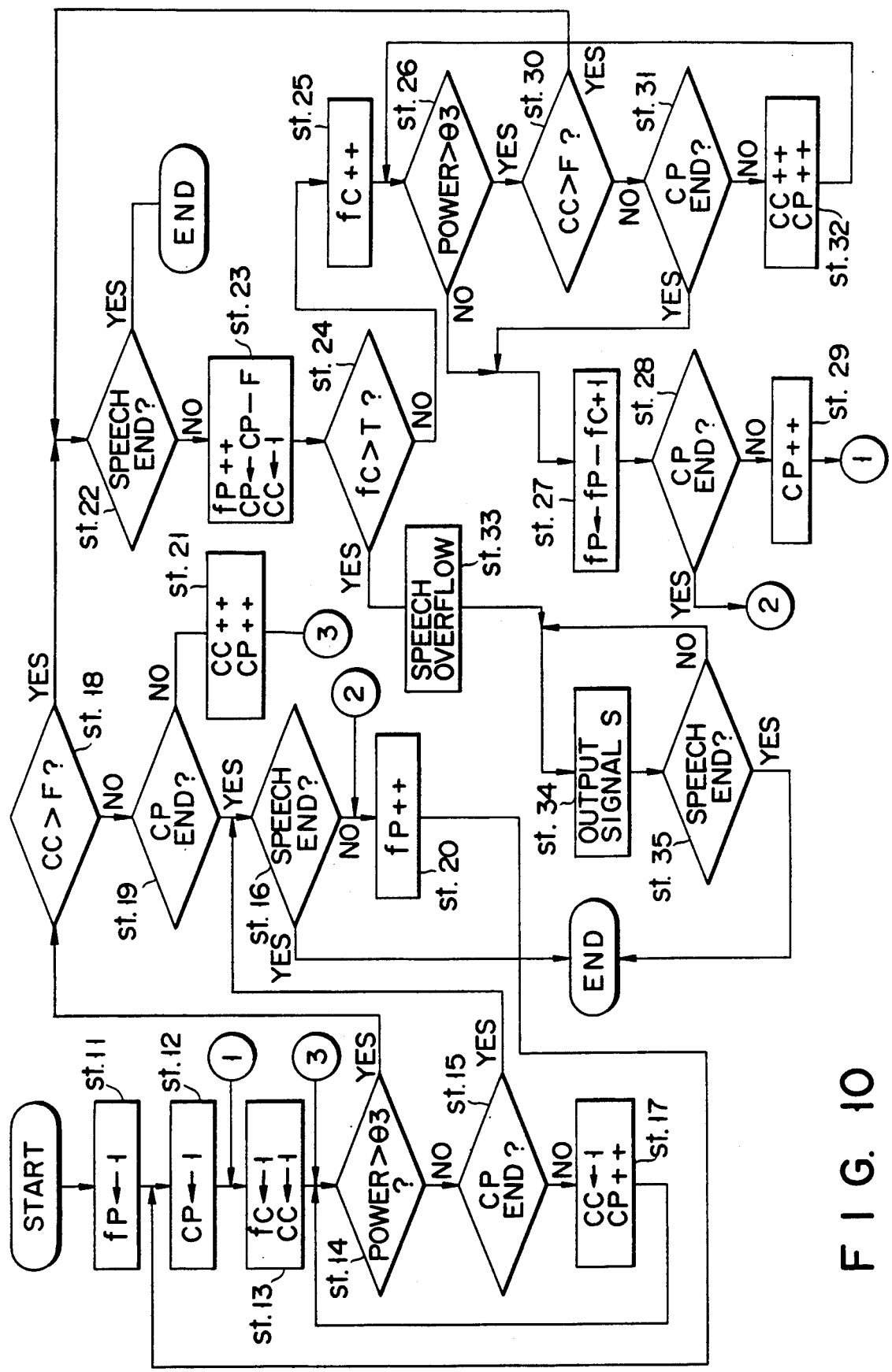
FIG. 10 is a flow chart explaining a method of detecting overflow speech according to the present invention.

FIG. 9A is a flow chart explaining an operation of the speech boundary detection of the CPU 8. FIG. 10 is a flow chart explaining the overflow determination of the CPU 8.

A method of detecting a speech boundary of input speech will be described below with reference to the flow chart in FIG. 9A.

The first step, st. 1 checks whether a start boundary candidate of input speech is found. If NO in st. 1, the flow advances to st. 2 to check whether the energy of a sound input through the microphone 1 is larger than a given reference value X (in a case shown in FIG. 9B, X=7). If NO in st. 2, the flow advances to the next frame, and processing is started from st. 1 again. If YES in st. 2, it is determined that a start boundary candidate is found, and the flow advances to the next frame. When YES is obtained in st. 1, the flow advances to st. 3 to check whether a start boundary is determined. If NO in st. 3, the flow advances to st. 4 to check whether input energy is larger than the reference value X. If NO in st. 4, the start boundary candidate is cancelled or denied, and the flow advances to a next frame to start processing from st. 1 again. If YES in st. 4, the flow advances to st. 5 to check whether the number of frames of part of the input energy, which is larger than a given reference value Y (in FIG. 9B, Y=10), is larger than a given reference number Z (in FIG. 9B, five frames of n−th to (n+4)th frames) of frames. If NO in st. 5, the flow advances to the next frame, and processing is started from st. 1 again. If YES in st. 5, a start boundary is determined, and the flow advances to a next frame.

When YES is obtained in st. 1 and st. 3, the flow advances to st. 6 to check whether an end boundary candidate is found. If NO in st. 6, the flow advances to st. 7 to check whether input energy is smaller than the reference value Y. If NO in st. 7, the flow advances to a next frame to start processing from st. 1 again. If YES in st. 7, it is determined that an end boundary candidate is found, and the flow advances to a next frame. When YES is obtained in st. 1, st. 3, and st. 6 the flow advances to st. 8 to check whether an end boundary is determined. If NO in st. 8, the flow advances to st. 9 to check whether input energy is smaller than the reference value Y. If NO in st. 9, the end boundary candidate is canceled, and the flow advances to a next frame to start processing from st. 1 again. If YES in st. 9, the flow advances to st. 10 to check whether the number of frames of part of the input energy, which is smaller than the reference value Y, is larger than a given reference number V (in FIG. 9B, Y=10) of frames. If NO in st. 10, the flow advances to a next frame, and processing is started from st. 1 again. If YES in st. 10, an end boundary is determined, and the flow advances to a next frame. When YES is obtained in st. 1, st. 3, st. 6, and st. 8, the processing is ended.

Figure 9B:
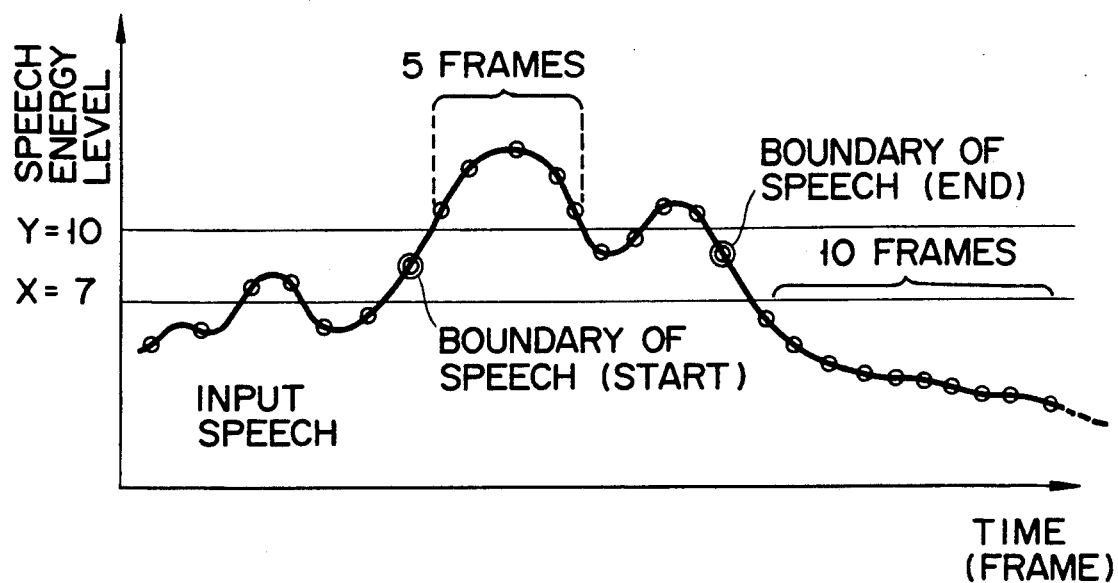

FIG. 9B is a graph showing an example of determination of start and end boundaries of the input speech. In this case, the given reference values X and Y are respectively set to be 7 and 10, and the given reference frame numbers Z and V are respectively set to be 5 and 10.

A method of detecting overflow of input speech in the CPU 8 will be described below with reference to a flow chart in FIG. 10.

The start boundary of a speech is determined first by the speech boundary detector 9 of FIG. 4 as shown in FIG. 9A, and overflow speech detection of FIG. 10 is started. In st. 11, a time pointer fp is set to one. In this case, the time pointer fp represents the number of frames of a speech feature parameter discretely sampled on the time base of input speech, in which the start boundary of an input speech is determined, from the start to end boundaries. In st. 12, a frequency pointer cp is set to one. In this case, the frequency pointer cp represents the number of channels obtained by dividing a speech feature parameter into several portions on the frequency axis. In st. 13, a timer counter fc and a frequency counter cc are set to one. In this case, the time counter fc and the frequency counter cc represent the number of pointers when a speech feature parameter exceeds the threshold value $\theta 3$. The flow then advances to st. 14 to check whether the power level of the speech feature parameter exceeds the threshold value $\theta 3$. If NO in st. 14, the flow advances to st. 15 to check whether the frequency pointer cp is ended. If YES in st. 15, the flow advances to st. 16 to check whether the speech is ended. If speech end is determined by the speech boundary detector 9, YES is obtained in st. 16, and the processing is ended. If NO in st. 16, the flow advances to st. 20 to add one to the time pointer fp. In this case, fp++ represents fp =fp+1.

If NO in st. 15, the frequency counter cc is set to one and one is added to the frequency pointer cp in st. 17. In this case, cp++ represents cp=cp+1.

The flow returns from st. 17 to st. 14. If YES in st. 14, it is checked in st. 18 whether the content of the frequency counter cc exceeds a given frequency interval F. If NO in st. 14, the flow advances to st. 19 to check whether the frequency pointer is ended. If YES in st. 19, the flow advances to st. 16. If speech end is determined by the speech boundary detector 9, YES is obtained in st. 16, and the processing is ended. If NO in st. 16, the time pointer fp is incremented by one in st. 20.

If NO in st. 19, the frequency counter cc and the frequency pointer cp are respectively incremented by one in st. 21 and the processing is started from st. 14 again. If YES in st. 18, it is checked in st. 22 whether the speech is ended. If a speech end is determined by the speech boundary detector 9, the processing is ended. If NO in st. 22, the time pointer fp is incremented by one in st. 23, and the frequency interval F is subtracted from the frequency pointer cp. The resultant value is then set in the frequency pointer cp, and the frequency counter cc is set to one. In st. 24, it is checked whether the time counter fc exceeds a given time T. If NO in st. 24, the time counter fc is incremented by one in st. 25, and the flow advances to st. 26 to check whether the power level of the speech feature parameter exceeds the threshold value θ3 shown in FIGS. 5 and 7. If NO in st. 26, the value of the time counter fc is subtracted from the contents of the time pointer fp in st. 27, and one is added thereto. The resultant value is then set as a new value of the time pointer fp. In st. 28, it is checked whether the frequency pointer cp is ended. If YES in st. 28, the processing is started from st. 20 again. If NO in st. 28, the frequency pointer cp is incremented by one in st. 29, and the processing is started from st. 13.

If YES in st. 26, it is checked in st. 30 whether the frequency counter cc exceeds the frequency interval F. If NO in st. 30, it is checked in st. 31 whether the frequency pointer cp is ended. If YES in st. 31, the flow advances to st. 27 to resume the processing. If NO in st. 31, the frequency counter cc and the frequency pointer cp are respectively incremented by one in st. 32, and the processing is started from st. 26 again. If YES in st. 24, overflow speech is determined in st. 33, and the overflow speech detecting signal S is output in st. 34. The flow advances to st. 35 to check whether the speech is ended. If NO in st. 35, the flow returns to st. 34 to continuously output the signal S. If a speech end is determined by the speech boundary detector 9, YES is obtained in st. 35. Then the processing is ended.

According to the above-described arrangement, input speech is not determined to overflow only when it exceeds a given threshold, but is determined to overflow only when a speech feature parameter exceeds a threshold value in a given frequency interval for a predetermined period of time or more. Therefore, even if pulse-like noise or speech which instantaneously exceeds a threshold is input, an overflow is not determined, and an input gain need not be unnecessarily decreased. As a result, in speech recognition, the problem of a decrease in recognition rate can be solved.

Figure 11:
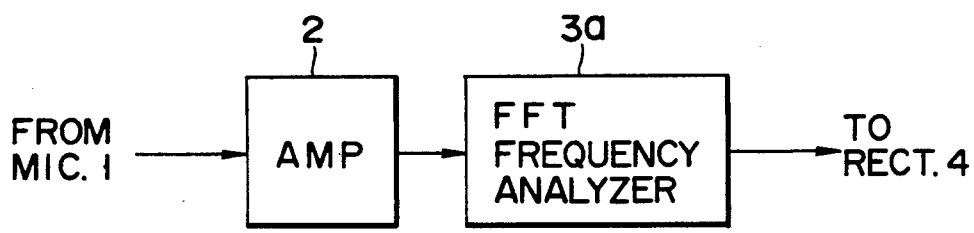
FIGS. 11 and 12 are block diagrams each showing another frequency analyzer.
Figure 12:
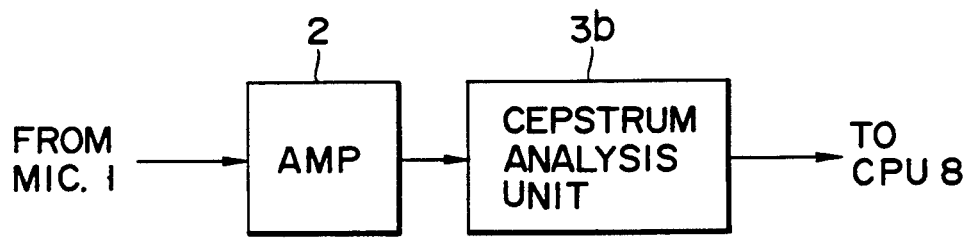

In the above-described embodiment of the present invention, as a method of extracting speech feature parameters, a method of performing frequency analysis using a BPF is described. However, instead of using the BPF 3 shown in FIG. 3, an FFT (Fast Fourier Transform) frequency analyzer 3a shown in FIG. 11 may be used. In addition, a feature analysis output obtained by a cepstrum analysis unit 3b shown in FIG. 12, a melcepstrum analysis unit, or an autocorrelation analysis unit may be used. In the case of cepstrum analyses unit 36, the output thereof may be supplied to the CPU 8. In a method of determining overflow speech, in addition to a rectangle F×T defined by the frequency direction F and the time base direction T shown in FIG. 8 in the above-described embodiment, an ellipse having axes in the time base direction T and the frequency direction F may be used to determine overflow speech. In addition, the area of a closed region exceeding the threshold value θ3 may be obtained so that overflow speech is determined when the obtained area exceeds a given threshold value S.

As has been described above, according to the present invention, since speech feature parameters are used as well as speech power to determine speech overflow, the correlation between the recognition performance of a speech recognition system and criterion of overflow speech is high because of the speech feature parameters. In addition, since speech overflow is determined when speech feature parameters not only at a given time point but also in a predetermined frequency interval exceed a given threshold for a predetermined period of time or more, or the speech feature parameters overflows, the correlation between speech recognition performance and evaluation of overflow speech is high.

What is claimed is:

1. An overflow speech detecting apparatus comprising:
   extracting means for extracting feature parameters from speech, yielding feature parameters for a plurality of successive time frames; and
   means for detecting speech overflow when said feature parameters have a width in excess of a predetermined width in a domain other than a time domain and exceed a predetermined value for at least a predetermined period of time over a predetermined number of successive time frames, said predetermined number being greater than one.

2. An apparatus according to claim 1, wherein said extracting means includes a frequency analyzer.

3. An apparatus according to claim 1, wherein said extracting means includes a melcepstrum analysis unit.

4. An apparatus according to claim 1, further comprising a sampling circuit for discretely sampling the feature parameters extracted by said extracting means during a predetermined sampling period.

5. An apparatus according to claim 1, wherein said detecting means includes means for detecting whether said series of said feature parameters has a predetermined number of successive feature parameters, each of which exceeds a threshold value for said predetermined period of time.

6. An apparatus according to claim 5, wherein a graph of said threshold value and said predetermined period of time defines a rectangle (F×T), wherein F is said threshold value and T is a length of said predetermined period T of time.

7. An apparatus according to claim 1, wherein said detecting means includes an amplifier connected to the extracting means and means for controlling the level of input gain of the amplifier.

8. An apparatus according to claim 1, wherein said detecting means further includes means for determining a speech boundary by checking a umber of frames of a part of the input energy.

9. An apparatus according to claim 1, wherein said domain other than the time domain is a frequency domain.

10. An apparatus according to claim 1, wherein said domain other than the time domain is a melcepstrum analysis domain.

* * * * *